(12) United States Patent
Donohoe et al.

(10) Patent No.: US 6,890,863 B1
(45) Date of Patent: May 10, 2005

(54) ETCHANT AND METHOD OF USE

(75) Inventors: Kevin G. Donohoe, Boise, ID (US); David S. Becker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/559,504

(22) Filed: Apr. 27, 2000

(51) Int. Cl.[7] .......................................... H01L 21/302
(52) U.S. Cl. ..................... 438/714; 438/723; 438/724; 438/720; 438/734; 438/740
(58) Field of Search ............................... 438/714, 723, 438/724, 720, 734, 740

(56) References Cited

U.S. PATENT DOCUMENTS

| | | | |
|---|---|---|---|
| 4,585,516 A | | 4/1986 | Corn et al. |
| 4,786,352 A | | 11/1988 | Benzing |
| 5,269,879 A | * | 12/1993 | Rhoades et al. ............ 156/643 |
| 5,562,801 A | * | 10/1996 | Nulty ...................... 156/643.1 |
| 5,880,006 A | * | 3/1999 | Lin et al. ..................... 438/424 |
| 5,980,767 A | | 11/1999 | Koshimizu et al. |
| 6,051,503 A | | 4/2000 | Bhardwaj et al. |
| 6,063,709 A | * | 5/2000 | Kuo et al. .................. 438/710 |
| 6,133,153 A | * | 10/2000 | Marquez et al. ............ 438/706 |
| 6,164,295 A | | 12/2000 | Ui et al. |
| 6,194,325 B1 | * | 2/2001 | Yang et al. ................. 438/740 |
| 6,211,092 B1 | * | 4/2001 | Tang et al. ................. 438/719 |
| 6,227,211 B1 | * | 5/2001 | Yang et al. .................. 134/1.1 |
| 6,329,292 B1 | * | 12/2001 | Hung et al. ................. 438/706 |
| 6,399,511 B2 | * | 6/2002 | Tang et al. ................. 438/714 |
| 6,403,488 B1 | * | 6/2002 | Yang et al. ................. 438/706 |
| 2001/0000246 A1 | * | 4/2001 | Tang et al. ................. 438/689 |
| 2001/0004552 A1 | * | 6/2001 | Tang et al. ................. 438/689 |
| 2002/0142598 A1 | * | 10/2002 | Tang et al. ................. 438/689 |

* cited by examiner

*Primary Examiner*—George A. Goudreau
(74) *Attorney, Agent, or Firm*—Workman Nydegger

(57) ABSTRACT

The present invention relates to a method of anisotropically etching a semiconductive substrate uses a hydrofluorocarbon etch gas with an etch selectivity fluorocarbon gas that previously was used to enhance oxide etching but not nitride selectivity. The present invention uses the fluorocarbon gas under conditions that enhance selectivity of the etch to nitride with respect to a bulk dielectric material such as doped and undoped silicon dioxide.

35 Claims, 7 Drawing Sheets

ETCHANT AND METHOD OF USE

BACKGROUND OF THE INVENTION

1. The Field of the Invention

The present invention relates to semiconductor device fabrication. More particularly, the present invention relates to etch processing of semiconductor structures. In particular, the present invention relates to a contact hole etch and process therefore that operates in the sub-half micron range, where the etchant includes a compound that is used as a selectivity enhancer.

2. The Relevant Technology

In the mciroelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive substrate, either alone or in assemblies comprising other materials thereon, and semiconductive material layers, either alone or in assemblies comprising other materials. The term substrate refers to a supporting structure including but not limited to the semiconductive substrates described above.

Miniaturization is the process of crowding an ever-increasing number of microelectronic devices into the same amount of semiconductive substrate real estate while maintaining and/or improving the quality of each microelectronic device. Miniaturization also requires improving and/or maintaining the integrity of interconnects and vias. The pressure to fabricate ever-smaller microelectronic devices on the active surface of semiconductive substrates consequently requires the formation of smaller topographical features that define the components of the microelectronic devices. One feature is the contact corridor, also known as the contact hole or channel (hereinafter "contact") which typically comprises a circular depression that extends through a dielectric layer to an underlying structure that is electrically conductive or electrically semiconductive.

As the miniaturization process progresses into the sub-half micron range, structural dimension tolerances become increasingly important such that processing sensitivity must be correspondingly improved. As an example, a contact in the subhalf-micron range preferably retains a critical dimension (CD) within a defined tolerance during a high-aspect ratio anisotropic etch through a dielectric layer. The contact, therefore, must retain its initial circular cross section and constant diameter cylindrical shape within the dielectric layer in order to avoid cutting into an underlying structure outside of the CD. Additionally, the CD cannot become so small that an open circuit is created due to the inability to fill the contact, or a destructively high resistance created by a too-narrow contact.

As used herein, the term "high-aspect ratio" refers to depth-to-bottom CD ratio of about five to one or more. In addition to contacts, high-aspect ratio sub-half micron width lines or trenches within a dielectric layer must be fabricated under conditions that require similar etch tolerances.

A dry, or plasma etch in an etch tool is the preferred process for etching a subhalf-micron contact. Inductively coupled, or high density etch systems are commonly referred to as etch tools. It would be desirable to etch a high-aspect ratio contact through a layer of dielectric in an etch tool while retaining the preferred CD.

Dielectrics may be materials such as borophosphosilicate glass (BPSG) or other materials such as oxides, nitrides, or dielectric anti-reflective coatings (DARC) that are placed between the mask and the substrate silicon. Processing parameters for the etching of a contact require the ability to maintain a CD for about a 2.2 microns deep feature, overetched by 0.4 microns and to generate a contact profile that is preferably only slightly tapered or more preferably substantially cylindrical. At the subhalf-micron geometry, an increase in the radius of the contact caused by a re-entrant profile may be sustained up to about 0.025 microns. Contacts with a depth of about 2.2 microns and between 0.2 and 0.45 microns for a CD would be considered to have achieved the required CD profile control.

Because the etching process typically involves a silicon oxide such as BPSG and an etch stop layer such as silicon nitride or other materials including doped or undoped silicon oxide, enhanced selectivity to the etch stop layer is required as fabrication proceeds into the subhalf-micron regime.

Another problem that exists in the prior art is that different etch types require different chamber wall temperatures. Where a high chamber wall temperature etch must be followed by a lower chamber wall temperature etch, transfer of the semiconductive substrate from the high chamber wall temperature etch to a low chamber wall temperature etch is required because of the inability to cool the high temperature etch chamber rapidly enough. Attempting to conduct a lower temperature etch in a hot, high temperature etch chamber may cause the lower temperature etch to malfunction and to consequently damage or destroy the semiconductor device being fabricated. It is therefore necessary to transfer the semiconductive substrate out of the high temperature etch chamber into a lower temperature etch chamber. Such a transfer is both time consuming and technically difficult where the necessity of maintaining the clean environment requires transfer to an etch chamber that may be remote and thermally insulated from the high temperature etch chamber. It would therefore be an improvement in the art to discover a method of etching for two traditionally different temperature etches with a closer temperature range or the same temperature range.

Applied Materials, Inc. of Santa Clara, Calif. currently offers an inductively-coupled plasma etcher identified as the Dielectric Etch IPS Centura® system (the "IPS system") for etching high-aspect ratio contacts, among other uses. The IPS system uses an inductively-coupled, parallel plate technology that employs temperature controlled Si surfaces within the etch chamber in combination with fluorine-substituted hydrocarbon etch gases to achieve an oxide etch having a selectivity to silicon nitride in excess of ten to one. U.S. Pat. No. 5,423,945, assigned to Applied Materials, Inc., discloses the structure of operation of a predecessor apparatus to the IPS system, a schematic of which is shown in FIG. 1. The disclosure thereof is incorporated herein by specific reference.

An IPS system 10 as depicted in FIG. 1 includes an etch chamber 12 primarily defined between a grounded silicon roof 14, an RF powered (bias) semiconductive substrate support 16 and a silicon ring 18 surrounding semiconductive substrate support 16, on which a semiconductive substrate 100 is disposed for processing. A plasma 20 generated over semiconductive substrate 100 is confined by magnetic fields as seen at reference numerals 22 and 24. Gases are supplied to chamber 12 through a valved manifold 26 which is connected to a plurality of gas sources (not shown). Evacuation of etch chamber 12 may be effected as desired through a valve 28, as is known in the art.

An RF source power is supplied to an inner antenna 30 and an outer antenna 32 by an RF generator 34. The inner and outer antennae 30 and 32 are tuned for resonance in order to provide an efficient inductive coupling with plasma 20. Inner antenna 30, outer antenna 32, RF generator 34 and associated circuitry comprise a source network 36. Bias power is also supplied to semiconductor substrate support 16 by RF generator 34. RF generator 34, supplying power to semiconductive substrate support 16, comprises a bias network 38 with associated circuitry as shown. RF bias power is delivered at 1.7±0.2 MHz, RF outer antenna power at 2.0±0.1 MHz, and RF inner antenna power at 2.3±0.1 MHz. Other details of IPS system 10 being entirely conventional, no further discussion thereof is required. Semi-conductive substrate 100 is attached to a monopolar electrostatic chuck 16.

A plasma etch process that was initially developed for use with the IPS system employs a gas flow of a relatively high rate and somewhat complex chemistry, relatively high process temperatures and, most notably, CO (carbon monoxide) in the gas mixture. Specifically, the process employs 300–400 (and preferably 358) standard cubic centimeters per minute (sccm) Ar (argon), 55 sccm CO, 82 sccm $CH_3$ (trifluromethane), and 26 sccm $CH_2F_2$ (difluromethane) with a process pressure of 50 mTorr. Source power input is about 1650 watts, apportioned as 1400 watts to the outer antenna and 250 watts to the inner antenna. Bias power is about 800 watts. According to the IPS system manufacturer, the high volume of Ar is required, or at least desirable, to maintain a plasma state within the etch chamber.

The IPS system employs the adjustable, dual-antenna inductive source and bias power control to adjust etch results. All high density oxide etch tools such as the IPS system can deposit from about 2,000 to about 4,000 angstroms per minute of fluorocarbon polymers on the semiconductive substrate under conditions if the bias power is set to zero. In other words, any surface that is not powered is exposed to a flux of pre-polymer material that will deposit on the surface unless conditions are altered to prevent its deposition.

Capacitative coupling is often a source of difficulty during etching. The common assignee of the present invention has filed several patent applications including U.S. application Ser. Nos. 09/021,155, entitled "Method of Modifying an RF Circuit of a Plasma Chamber to Increase Chamber Life and Process Capabilities"; and 09/031,400, entitled "Apparatus for Improved Low Pressure Inductively Coupled High Density Plasma Reactor"; and 09/020,696, entitled "Method and Apparatus for Controlling Electrostatic Coupling to Plasmas", regarding the control of this capacitative coupling. Disclosures of the aforementioned three patent applications are incorporated herein by specific reference.

Some of the high density oxide etch tools have virtually no capacitive coupling between the source coil and the plasma. For example, the IPS system, as identified hereinabove has virtually no such coupling. The conducting silicon roof on the IPS system acts as an electrostatic shield which eliminates electrostatic coupling between the source coil and the plasma. Thus, roof temperature may be used to control the amount of deposition that occurs on the roof of the IPS system. Additionally, the IPS system uses a reactive surface to line the chamber walls or parts of the walls. The IPS system uses silicon which it heats to temperatures that are too high to permit deposition but that are sufficiently high to scavenge free fluorine from the etch plasma.

It would be advantageous to develop a process for use with the IPS system or an equivalent system that would be simple and easy to control and optimize while still meeting manufacturing specifications for the high-aspect ratio contacts and other apertures, such as lines or trenches which may be formed in a substrate. Such a process would be expected to yield similar results in any inductively-coupled plasma etcher which employs silicon surfaces at elevated temperatures within the etch chamber.

It would also be advantageous to develop a process for use with the IPS system which would be versatile enough to allow different etch types to be conducted on the same semiconductive substrate without requiring a transfer of the semiconductive substrate from one etch tool to another due to disparate temperature differences between the two etch types.

Such gas etchant mixtures and methods of use are disclosed and claimed herein.

SUMMARY OF THE INVENTION

The present invention relates to a process for anisotropically etching through silicon dioxide and stopping on an underlying layer. The present invention provides a process that is suitable for use in a high density etch tool, such as the Applied Materials IPS Centura® system, for etching silicon dioxide by employing an inventive gas mixture and delivering the gas mixture at a low flat rate and at relatively low process temperatures. Under these conditions, the low temperatures used in the inventive method allow the use of an etch gas mixture that etches the silicon dioxide dielectric layer substantially anisotropically and which stops etching on an underlying layer that is compositionally dissimilar to the silicon dioxide dielectric layer. The underlying layer can be composed of a nitride compound such as a refractory metal nitride or silicon nitride, or it may be a silicon dioxide underlying layer with different doping from the silicon dioxide dielectric layer. Alternatively, the underlying layer may be a silicon material such as a monocrystalline silicon substrate or it may be polysilicon.

The inventive process employs a mixture of two preferred etchant gases: a hydrofluorocarbon and a selectivity compound consisting of carbon and fluorine, wherein the latter is a selectivity enhancing gas that is preferably one of $CF_4$, $C_2F_6$, $C_4F_8$, $C_5F_6$, $C_5F_8$, and combinations of these. The etch gas flow rates are extremely low. The etch gas flow rates are on the order of about 30 to about 50 sccm of hydrofluorocarbon, preferably $CH_3$. The selectivity enhancing gas flow rate is from about zero to about 25 sccm the selectivity compound, preferably $CF_4$.

Etch selectivity fluorocarbon gases, intended herein to mean $CF_4$, $C_2F_6$, $C_4F_8$, $C_5F_6$, $C_5F_8$, and the like and combinations of these, have been used in previous applications as etch gases, but not as a selectivity enhancing etch gas for nitride or silicon compounds while etching oxides on semiconductive substrates. During development of the present invention, it was discovered that under the operating conditions set forth herein, increased etch selectivity fluorocarbon etch gas in addition to the hydrofluorocarbon etch gas such as $CHF_3$ etch gas, caused an increased etch selectivity for a nitride compound, or a silicon dioxide underlying layer doped differently from the silicon dioxide dielectric layer.

The present invention is also useful for processing different types of etches such as a mask-aligned contact etch at an etch chamber roof surface temperature in a range below about 200° C. and a self-aligned contact etch in the same etch chamber in the same temperature range. Thereby, etching may be carried out within the same etch chamber where previously self-aligned contact etching needed to be carried out in a high temperature etched chamber, or the high-aspect ratio mask-aligned contact etch chamber could be used but a significant amount of time was needed to allow the etch chamber to cool.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention employs two etchant gases: a hydrofluorocarbon etch gas and an etch selectivity fluorocarbon gas. The gas flow rates are extremely low, on the order of from about 30 to about 50 sccm (standard cubic centimeters per minute) for the hydrofluorocarbon gas and from about zero to about 25 sccm for the etch selectivity fluorocarbon gases. The hydrofluorocarbon etch gas may include $CHF_3$, $CH_2F_2$, $CH_3F$, $C_2HF_5$ and the like, and combinations of these. The etch selectivity fluorocarbon gases may include $CF_4$ or quantities of the higher carbon fluorocarbons such as $C_2F_6$, $C_4F_8$, $C_5F_6$, $C_5F_8$, and the like and combinations of these. The etch selectivity fluorocarbon gases provide enhanced selectivity under the inventive process conditions instead of their usual behavior as selectivity reducers.

Under relatively low pressure processes in the range from about 10 to about 40 mTorr, the above-mentioned flow rates are preferred. For higher pressure processes in the range of from about 40 to about 100 mTorr, higher proportional flow rates may be used. For example, $CHF_3$ and $CF_4$ flows may be in the range from about 0 to about 100 sccm.

The inventive etch method is carried out in dielectric materials, by way of example in the form of boron phosphorus silicate glass (BPSG) and other doped and undoped dielectrics films used in semiconductive microelectronic device fabrication. Such doped and undoped dielectric films may include $SiO_2$, tetraethyl orthosilicate (TEOS), and phosphorus silicate glass (PSG).

A variant of the inventive process employs only a hydrofluorocarbon such as $CHF_3$ during the initial portion of the etch process and adds an etch selectivity fluorocarbon gas in the final portion of the etch process to increase the etch selectivity to the underlying layer such as a silicon nitride layer ($Si_3N_4$ and the like) or other compositionally dissimilar dielectric layers, such as a silicon dioxide underlying layer with different doping from the silicon dioxide dielectric layer.

Another variant of the inventive process employs the injection of a hydrofluorocarbon gas such as $CHF_3$ during the etch process and pulses an etch selectivity hydrofluorocarbon gas such as $CF_4$ over a concentration range and for a pulse time period to improve the etch selectivity to the underlying layer.

Reference will now be made to the figures wherein like structures will be provided with like reference designations. It is to be understood that the drawings are diagrammatic and schematic representations of some embodiments of the present invention and are not limiting of the present invention nor are they necessarily drawn to scale.

Figure 1:
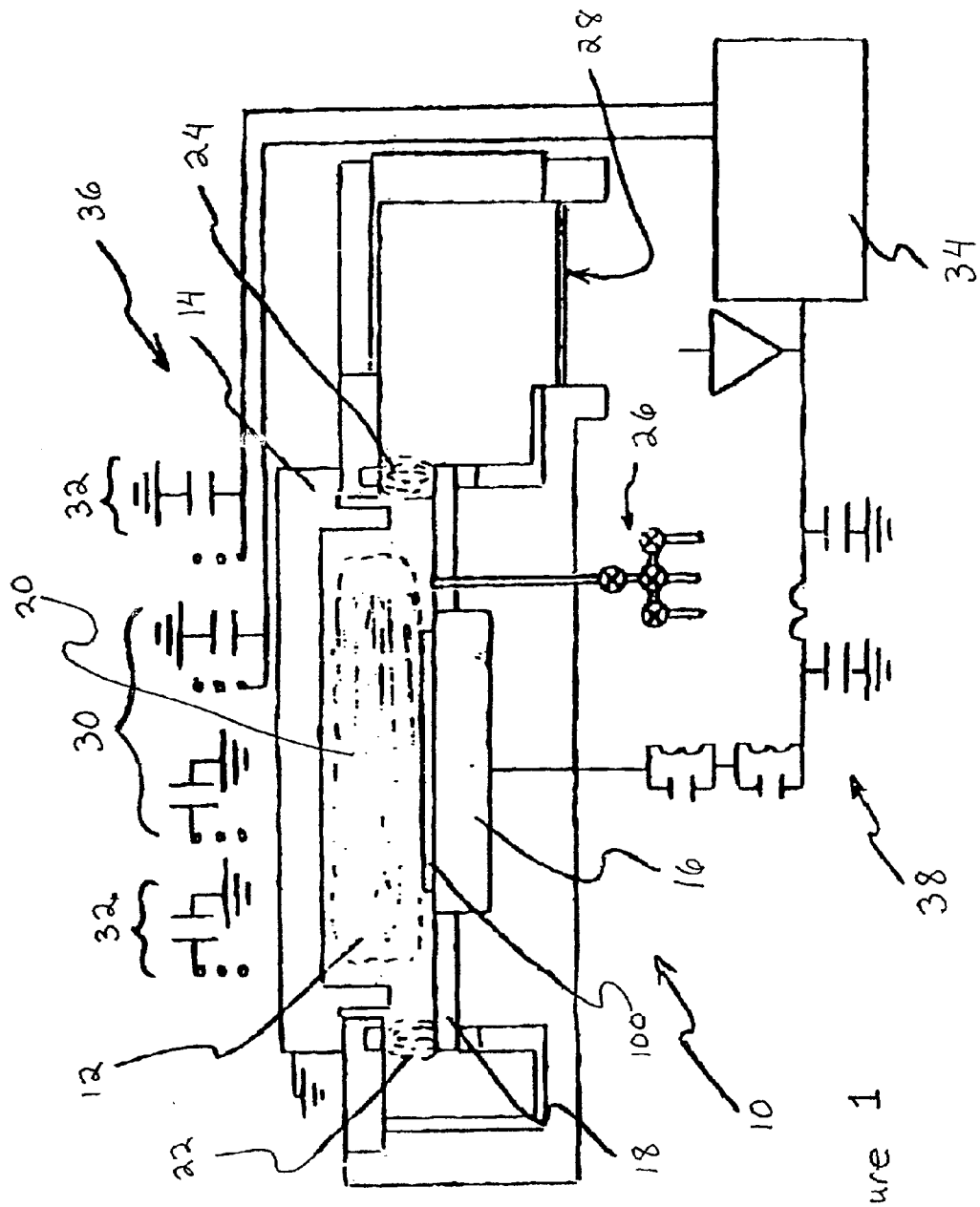
FIG. 1 is a cross-sectional and wiring schematic of the Applied Materials, Incorporated Dielectric Etch IPS Centura® system, suitable for use with the process of the present invention and together therewith comprising an embodiment of an inventive etch system.

The system chamber, referring to FIG. 1, is defined and controlled at roof 14 over semiconductive substrate end ring 18 surrounding semiconductive substrate 100. Roof 14 also has sidewalls as depicted and is held to a roof surface temperature within a range from about 100° C. to about 190° C., more preferably from about 100° C. to less than about 150° C., and most preferably from about 100° C. to less than about 140° C. Ring 18 is held within a range from about 180° C. to about 300° C., preferably from about 190° C. to about 250° C., and most preferably about 200° C. A preferred temperature comprises the lowest at which the IPS system is operable under continuous semiconductive substrate processing conditions. Further, a roof temperature below about 140° C. is the preferred temperature which may be employed with the inventive gas mixture to conduct the selective etch process of the invention without experiencing over-etching of the silicon nitride or silicon structures which are present in a microelectronic device beneath a compositionally different bulk dielectric. A roof temperature of about 200° C. is also acceptable.

The temperature of semiconductive substrate support 16 is contained in a range from between about −20° to about +80° C. and most preferably about +40° C. The pressure of etch chamber 12 is maintained at greater than about 1 mTorr, more preferably greater than about 15 mTorr, and most preferably greater than about 20 mTorr.

Source power to etch chamber 12 is preferably maintained between about 750 and about 1250 Watts, at a ratio of about four to one between outer antenna 32 and inner antenna 30, and most preferably about 1000 Watts with about 875 Watts to outer antenna 32 and about 125 watts to inner antenna 30. Bias power at semiconductive substrate support 16 is preferably maintained at about 400 to about 800 Watts, preferably from about 500 to about 700 Watts, and most preferably about 600 Watts.

The process parameters disclosed herein have been used to produce high-aspect ratio CD features. The CD features were defined through BPSG using an I-line photoresist as well as deep ultraviolet (DUV) photoresist. Specifically the CD features formed using I-line photoresist where in a range from about 0.2 microns to about 0.6 microns, and from about 0.2 microns to about 0.4 microns. For a DUV photoresist, the CD features formed greater than or equal to about 0.1 microns to about 0.5 microns, from about 0.2 microns to about 0.4 microns, and about 0.3 microns. A suitable example of an I-line resist is the Sumitomo PFI-66A7 resist, offered by Sumitomo of Osaka, Japan while a suitable DUV resist is the TOK-TOUR-P024 resist, offered of TOK of Saguki, Japan.

Two-Stage Gas Etching

Figure 2A:
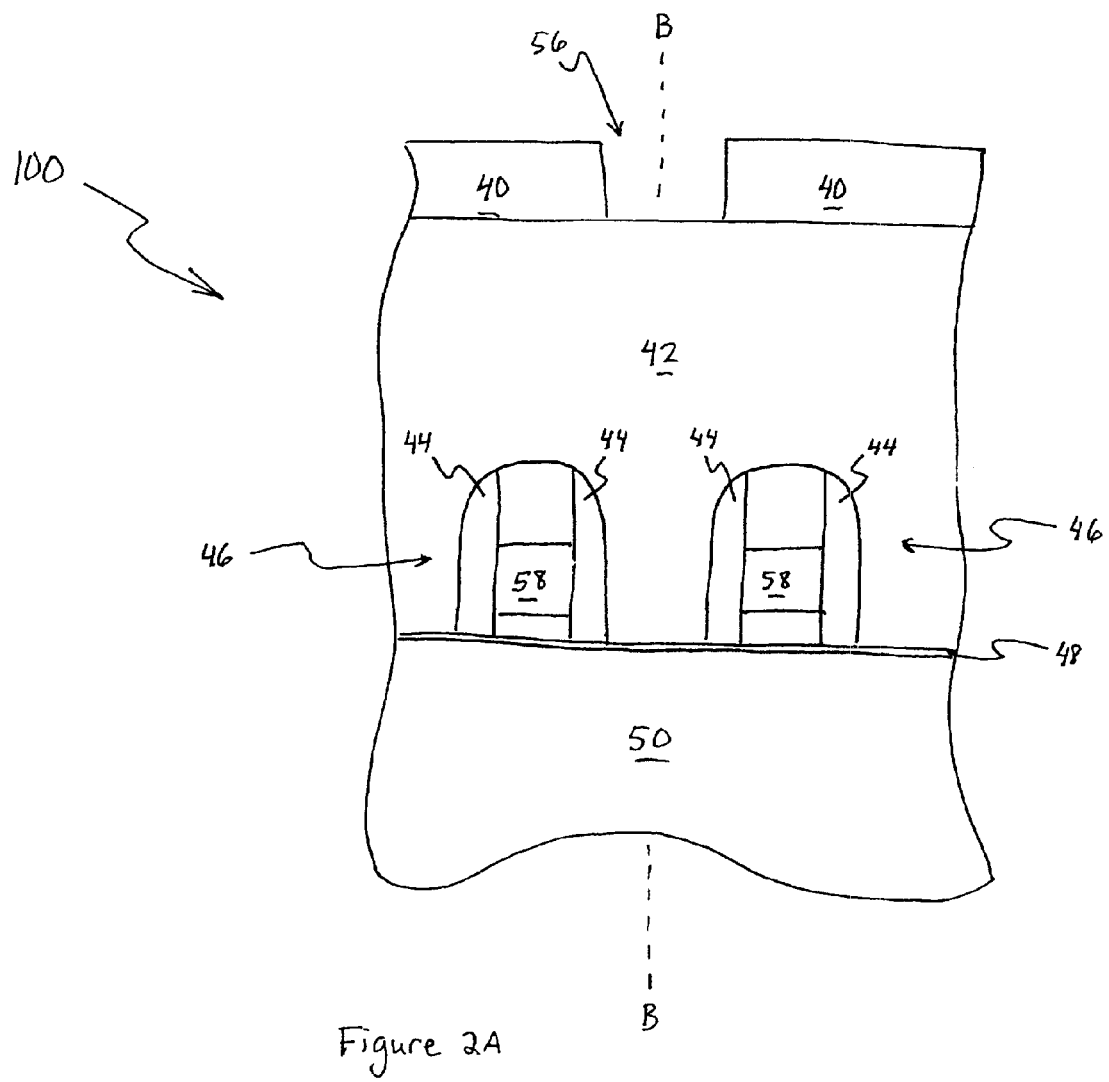
FIG. 2A is an elevational cross-section view of a semiconductor substrate that has been patterned with a mask in preparation for a self-aligned contact etch.

A first embodiment of the present invention includes providing a semiconductive substrate 100 in an etch tool such as the Applied Material IPS system. Referring to FIG. 2A, etching is carried out by patterning a mask 40 upon a bulk dielectric 42 that is disposed upon an etch stop layer 44. Etch stop layer 44 may cover structures such as a gasket stack 46. Gate stack 46 is disposed upon a gate oxide layer 48 that is ultimately disposed upon a semiconductive material 50.

Dielectric 42 is composed of silicon dioxide ($SiO_2$) which can be described as being either undoped or doped glass. In the semiconductor industry, the term oxide is generally used instead of glass. Generally, an undoped oxide is either a field oxide or gate oxide which is usually grown in a furnace. Doped oxides include BPSG, PSG, etc. which are generally formed on silicon semiconductive substrate 100 with a dopant gas(es) during a deposition process. Dielectric 42 is deposited onto adjacent, spaced apart gate stacks 46 as well as other surfaces on semiconductive substrate 100. Gate stacks 46 include spacers 44 and are fabricated by a spacer etch process from an etch stop layer composed of silicon nitride or a silicon oxide material that is compositionally different from dielectric 42.

Mask 40 comprises a photoresist layer having an opening 56 for forming a predetermined pattern. Typically, this is accomplished using a semiconductor photomask and known conventional etch mask patterning techniques.

Figure 2B:
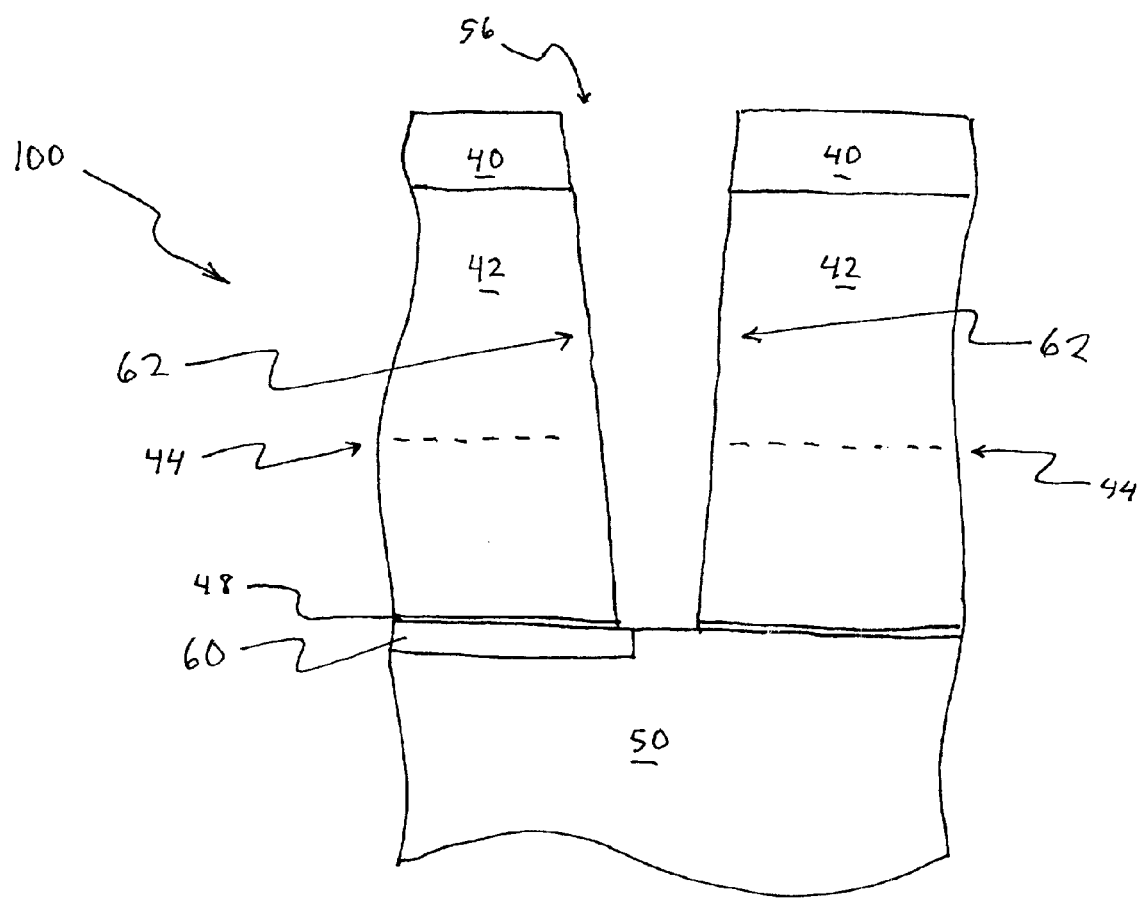
FIG. 2B is an elevational cross-section view of the semiconductive substrate depicted in FIG. 2A, taken along the line B—B.

FIG. 2B is an elevational cross-section view of semiconductive substrate 100 depicted in FIG. 2A, taken along the section line B—B to depict a perpendicular view thereof. The etch is also useful for stopping on structures such as a shallow trench isolation 60 as depicted in FIG. 2B. An etch profile 62 is contemplated with the present invention that may cause a slight taper shape as the contact is formed beginning at opening 56. Additionally, the etch will stop at and/or pass beyond spacers 44, depicted in FIG. 2B as a phantom line as spacers 44 are not intersected by section line B—B.

The gas plasma etch technique employed herein typically has an etching area in a plasma and is generated under vacuum within the confines of an RF discharge unit. The preferred plasma etch technique employed herein may include the use of Electron Cyclotron Resonance (ECR), reactive ion etch (RIE), magnetically enhanced reactive ion etch (MERIE), Plasma etching (PE) reactive ion, point plasma etching, magnetically confined helicon and helical resonator, PE, or magnetron PE. In plasma dry etchers, typically the upper electrode is powered while the lower electrode is grounded. In RIE etching, the lower electrode is powered while the upper electrode is grounded. In triode dry etchers, the upper and lower electrodes can be powered as well as the sidewall. In MERIE etching, magnets are used to increase the ion density of the plasma. In ECR etching, the plasma is generated upstream from the main reaction chamber. This produces a low ion energy to reduce damage to the semiconductive substrate.

A semiconductor device is located in a desired etcher within an etching area and is etched with a fluorinated chemical etchant system to form a predetermined pattern therein. The fluorinated chemical etchant system may comprise a chemical etchant composition of the type described above such as $CHF_3$, $CF_4$, Ar, and optionally a $CH_2F_2$ additive material. The fluorinated chemical etchant system is substantially in a gas phase during the etching of the multilayer structure.

Referring again to FIG. 2A, the exposed dielectric layer 42, composed of $SiO_2$, is etched anisotropically at a relatively high etch rate down to spacers 44, composed of $Si_3N_4$ or a differently doped $SiO_2$ compared to dielectric layer 42, and serving as an etch stop layer. Portions of dielectric layer 42 are selectively removed by chemically enhanced ionic bombardment. Some areas of semiconductive substrate 100 continue to have the $SiO_2$ of dielectric layer 42 available to be etched while other areas of semiconductive substrate 100 are not etched in that the etch has already exposed spacer 44 where the etching process effectively stops because of polymer formation on the surface of spacer 44. In this way, the etching process can provide for the formation of the upright sidewalls in etched layers which are substantially conformal to the remaining surface while providing etch selectively to the etch stop layer.

When RF energy is applied to the chamber, at least the upper electrode, the gas fed into the chamber via the gas distribution plate is converted to plasma. The plasma contains reactive chemical species which will etch selected unmasked portions of the semiconductive substrate electrostatically clamped to the lower electrode. A throttle valve located between the plasma etching chamber regulates the pressure of the chamber to processing values, generally in the range of 10–350 mTorr.

IPS System 10 is governed by a programmable computer that is programmed to prompt the machine to evacuate and vent the load locks, transfer semiconductive substrates to and from the cassettes, elevator, and etch chamber, control the delivery of process gas, RF power, and magnetic field to the plasma etching chamber, and maintain the temperature of the semiconductive substrate in the plasma etching chamber, all at appropriate times and in appropriate sequence.

Given the foregoing environment, a multilayer structure, such as a semiconductor substrate, is located within the plasma etching chamber and is etched with a fluorinated chemical etchant system to form a predetermined pattern therein.

In the case of the chemical etchant composition including $CHF_3$, $CF_4$ and Ar, the exposed $SiO_2$ layer may be selectively etched at a relatively high etch rate and high selectivity down to the $Si_3N_4$ etch stop layer by removing predetermined portions of the $SiO_2$ layer using chemically enhanced ionic bombardment of the gas phase etchant material.

Etching is carried out by the formation of a self-aligned contact hole through mask 40 and dielectric 42 that uses a first etch gas, namely the hydrofluorocarbon gas $CHF_3$ in a first etch gas recipe to a first etch depth. The $CHF_3$ has a first nitride etch selectivity. Etching continues with an etch selectivity fluorocarbon gas that is blended with the $CHF_3$ to form a second etch gas recipe. The etch selectivity fluorocarbon gas may include any or all of $CF_4$, $C_2F_6$, $C_4F_8$, $C_5F_6$, $C_5F_8$, and the like. The etch selectivity fluorocarbon gas is used in etching the oxide layer as a continuation of the $CHF_3$ first etch gas. The etch selectivity fluorocarbon gas when blended with the $CHF_3$ first etch gas has a second nitride selectivity that is greater than the first nitride etch selectivity. Under the inventive conditions, the method of etching the semiconductive substrate stops the self-aligned contact hole upon a nitride layer or upon semiconductive material 50.

As one alternative of this embodiment, the hydrofluorocarbon gas $CHF_3$ as the first etch gas may be used in connection with $CH_2F_2$ gas. The ratio of $CHF_3$ to $CH_2F_2$ may be from about 10:1 to about 1:10, preferably about 1:1, and most preferably about 5:1.

In another alternative of this embodiment, the hydrofluorocarbon gas $CHF_3$ is used with the fluorocarbon gas $C_2F_6$ and may be provided in ratios from about 10:1 to about 5:1, preferably about 10:1.

Preferably for this embodiment, the nitride etch selectivity enhancing gas is the etch selectivity fluorocarbon gas. In a preferred embodiment, the etch selectivity fluorocarbon gas is $CF_4$. In another embodiment the etch selectivity fluorocarbon gas is provided with $CF_4$ and $C_4F_8$. The ratio of $CF_4$ to $C_4F_8$ may be in a range from about 10:1 to about 1:10, preferably about 1:1, and most preferably about 5:1. The etch selectivity fluorocarbon gas may also be a combination of $CF_4$ and $C_5F_8$. Additionally, it may be the combination of $CF_4$ and $C_5F_6$. The relative proportions of $CF_4$ to its other etch selectivity fluorocarbon gas for the above two examples are in a range from about 10:1 to about 1:10, preferably about 1:1 and most preferably about 5:1.

The relative proportions of the hydrofluorocarbon etch gas to the etch selectivity fluorocarbon gas include the etch gas, particularly $CHF_3$ in a range from about 30 to about 50 parts in comparison with the etch selectivity fluorocarbon gas in a range from about less than one part to about 25 parts. Preferably, the etch selectivity fluorocarbon gas is supplied in about 15 parts and the first etch gas, particularly $CHF_3$ is applied in about 44 to about 45 parts.

Where the etch selectivity fluorocarbon gas includes higher carbon number gases including at least one of $C_2F_6$, $C_4F_8$, $C_5F_6$, and $C_5F_8$, the preferred proportion of the etch selectivity fluorocarbon gas is in a range from about 0.5 to about 4 parts, most preferably from about one part to about 2 parts, in comparison with the first etch gas, particularly $CHF_3$ which will be in a range from about 30 to about 50 parts, and preferably about 44 to 45 parts.

Pulsed Fluorocarbon Gas Etching

Another embodiment of the present invention includes providing semiconductive substrate 100 in an etch tool such as the Applied Materials IPS system. Referring again to FIG. 2A, etching is carried out by patterning mask 40 upon bulk dielectric layer 42 that is disposed upon etch stop layer 44. Etch stop layer 44 may cover other structures such as gate stack 46. Gate stack 46 is disposed upon gate oxide layer 48 that is ultimately disposed upon semiconductive material 50.

The pulsed fluorocarbon gas etch technique of this embodiment is carried out under conditions similar to the 2-stage gas etching set forth above. A semiconductor device is located in a desired etcher with an etching area and is etched with the inventive fluorinated chemical etchant system to form a predetermined pattern therein. The fluorinated chemical etchant system may comprise a chemical etchant composition of the type described above such as $CHF_3$, $CF_3$, Ar, and optionally a $CH_2F_2$ additive material. The fluorinated chemical etch system is substantially in a gas phase during the etching of the multi-layer structure.

Exposed dielectric layer 42, composed of $SiO_2$, is selectively and anisotropically etched at a relatively high etch rate, and the etch rate is moderated by the pulsing of fluorocarbon gas into the etch recipe.

Etching is carried out by formation a self-aligned contact hole through mask 40 and dielectric 42 that uses a first etch gas, namely the hydrofluorocarbon gas $CHF_3$ or the like as a constant etch gas source. Etching is carried out further with the pulsing of an etch selectivity fluorocarbon gas that is intermittently blended with the hydrofluorocarbon gas during the etch process. Pulsing of the fluorocarbon gas is carried out in a range from about 0 sccm to about 25 sccm, preferably from about 15 to about 23 sccm, and most preferably from about 18 to about 22 sccm.

The time period of an overall gas pulsing cycle is in a range from about 10 to about 60 seconds, preferably from about 15 to about 30 seconds. The cycle of the fluorocarbon gas pulse has a period in a range from about 1 second to about 30 seconds, preferably from about 10 seconds to about 20 seconds, and most preferably about 15 seconds.

Determination of a Specific Etch Recipe

In another embodiment of the present invention, a method is provided of etching an oxide disposed upon a nitride with etch selectivity to the nitride layer. This inventive method uses the discovery that a fluorocarbon gas is an etch selectivity enhancer under the inventive conditions, and illustrates a method of finding a preferred etchant gas recipe based upon the inventive discovery.

The method of the second embodiment includes providing an oxide disposed upon a nitride layer that is exposed to a first etching process using $CHF_3$ with an etch selectivity fluorocarbon gas under the inventive conditions in which the etch selectivity fluorocarbon gas makes the first etching process selective to the nitride layer as set forth above. The inventive method continues by incrementally increasing the etch selectivity fluorocarbon gas and initiating a second etching process for the oxide using the $CHF_3$ and the increased etch selectivity fluorocarbon gas under conditions which the increased etch selectivity fluorocarbon gas makes the second etching process more selective to the nitride layer than the first etching process. The inventive method may optionally continue by repeating incrementally increasing the etch selectivity fluorocarbon gas and etching the oxide with the $CHF_3$ and the incrementally increased amount of etch selectivity fluorocarbon gas under the inventive conditions. Accordingly, an increased amount of etch selectivity fluorocarbon gas makes the etch more selective to the nitride layer than the second etching process.

As the degree of etch selectivity is noted in this inventive method, one can then choose a preferred amount of etch selectivity fluorocarbon gas in relation to the $CHF_3$ to achieve a chosen etch selectivity-to-nitride based upon the first etching process, the second etching process, and the optional etching(s) thereafter. Accordingly, etching may then be carried out on a single semiconductive substrate or upon a batch of semiconductive substrates by etching the oxide to stop on the nitride layer under the chosen etch selectivity-to-nitride conditions.

The etch selectivity fluorocarbon gas may include those gases set forth above and in the ratios among themselves and the proportions to the $CHF_3$ as set forth above. Preferably, the present invention will be carried out under etching conditions where the roof surface temperature is below about 200° C., preferably below about 160° C., more preferably below about 150° C. and most preferably about 140° C.

In a series of tests, a method was provided for etching a dielectric as depicted in FIG. 2A in order to determine a preferred mixture for a preferred etch recipe that is selective to a nitride etch stop layer. The dielectric layer 42 is patterned with a mask 40. Dielectric 42 is disposed upon semiconductive layer 50 which may be protected by gate oxide 48. Upon gate oxide 48 gate stacks 46 are disposed, each having spacers 44 made of a material preferably different in composition from dielectric 42. Besides spacer 44 being a silicon nitride, it may also be made from refractory metal nitrides such as cobalt nitride, titanium nitride, tungsten nitride, hafnium nitride, and the like.

Figure 3:
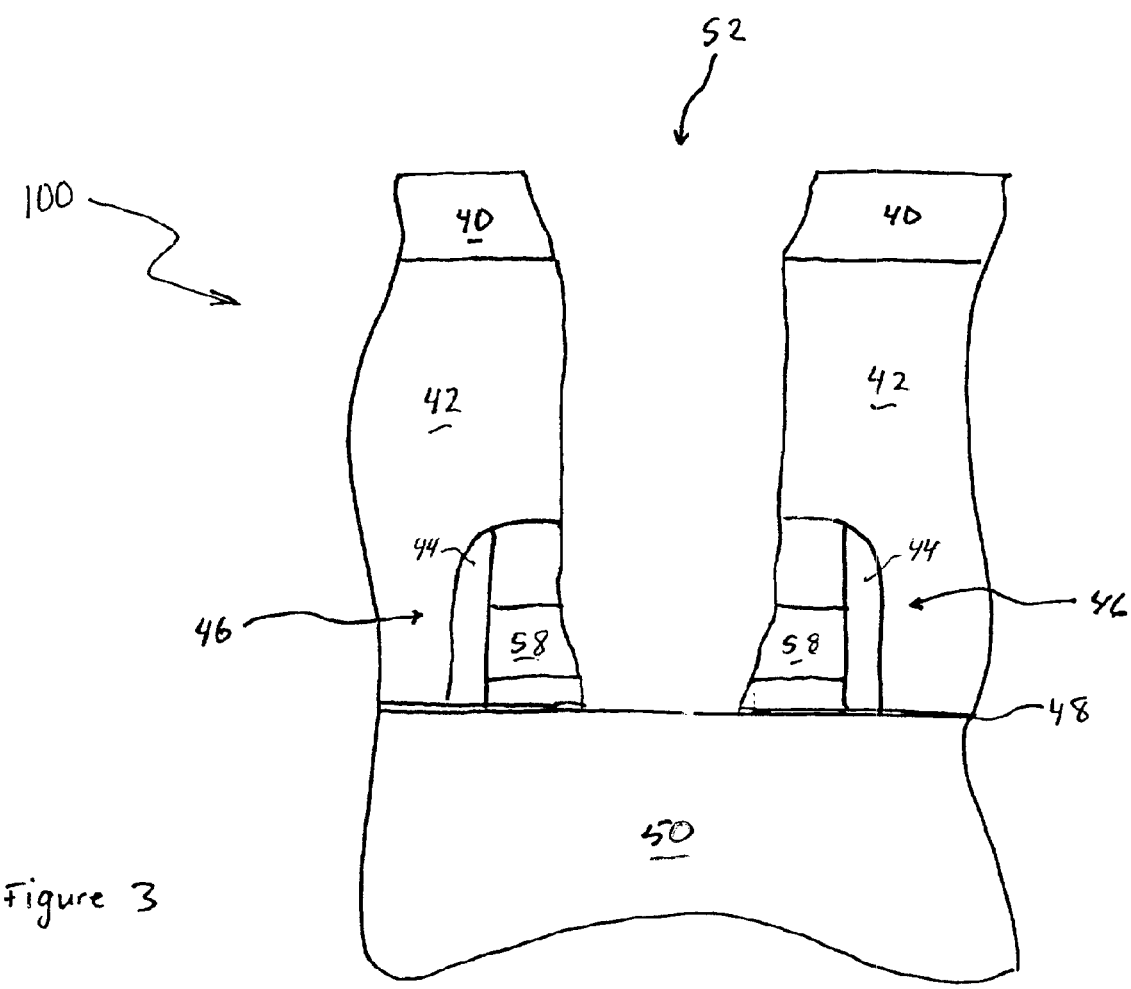
FIG. 3 is an elevational cross-section view of the semiconductive substrate seen in FIG. 2A under etch conditions disclosed herein without the presence of $CF_4$.

In the first test, a self-aligned contact anisotropic etch is carried out as depicted in FIG. 3. In this example, spacer 44 is a nitride layer or a silicon dioxide layer that is doped differently from dielectric layer 42 and etching is carried out with $CHF_3$ under the inventive conditions. A contact 52 is formed in dielectric 42 and the first etching process using $CHF_3$ cuts into gate stack 46 by not being significantly selective to spacer 44 as it is exposed during the formation of contact 52. FIG. 3 illustrates damage to gate stack 46 due to the lack of selectivity to spacer 44 over dielectric 42 which is an oxide such as $SiO_2$, BPSG, TEOS, and PSG. Additionally, spacer 44 may be undoped oxide such as TEOS, or it may be an oxide with different doping from dielectric 42 including where dielectric 42 is undoped oxide.

Figure 4:
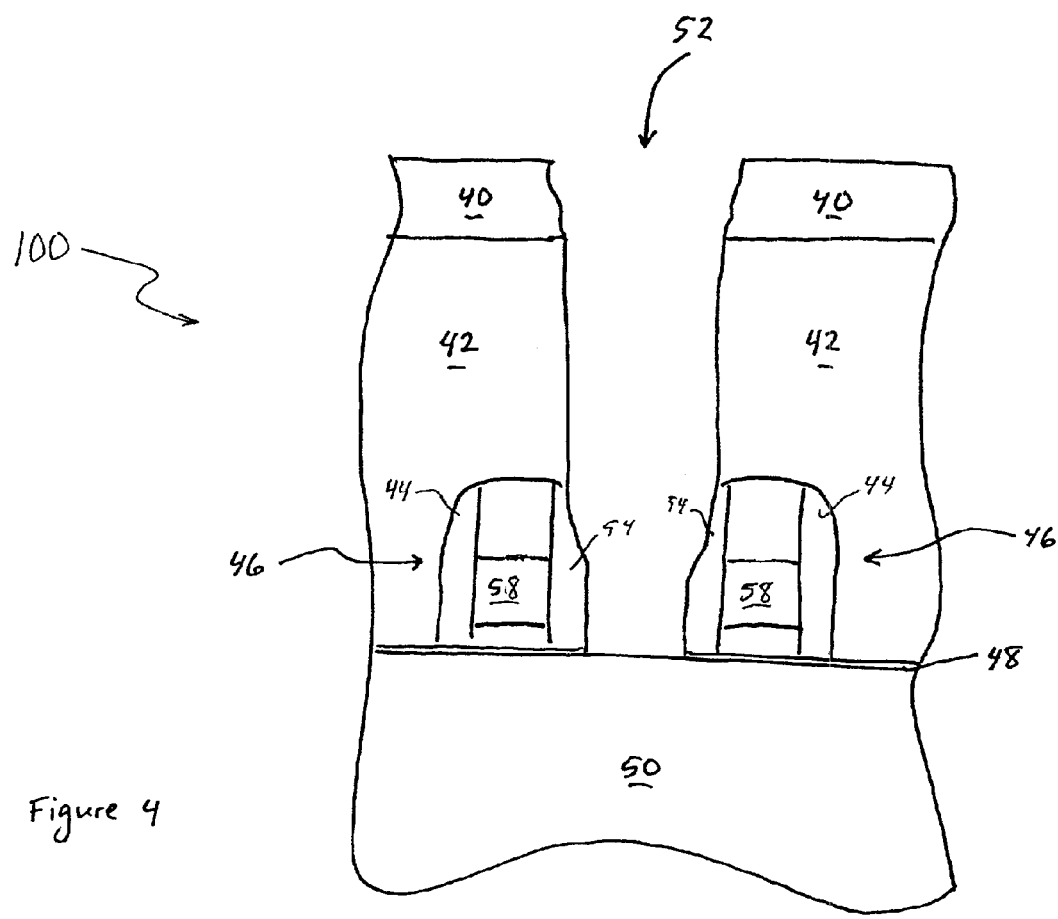
FIG. 4 is an elevational cross-section view of the semiconductive substrate seen in FIG. 2A under etch conditions containing about a 10% gas presence of $CF_4$.

In the test, semiconductive substrate 100 is etched using $CHF_3$ and $CF_4$ in a ratio of about 45 parts $CHF_3$ and 5 parts $CF_4$. Under equivalent etch conditions as those depicted in FIG. 3, FIG. 4 illustrates the formation of contact 52 down to the level of semiconductive layer 50 where spacer 44 within contact 52 has been etched to a degree that is less than that depicted in FIG. 3, to form an eroded spacer 54. Where the etch conditions were similar to the first test, it is concluded that the pressure of $CF_4$ has made the etch recipe more selective to the nitride of spacer 44 in order to form contact 52 and eroded spacer 54 to the degree where eroded spacer 54 may or may not be entirely laterally branched to expose electrically conductive elements such as polysilicon lines 58 within gate stack 46. Where it is preferable not to form eroded spacer 54, even where eroded spacer 54 is not entirely breached, it is instructive to conduct another example by increasing the amount of $CF_4$ gas in the etch recipe.

Figure 5:
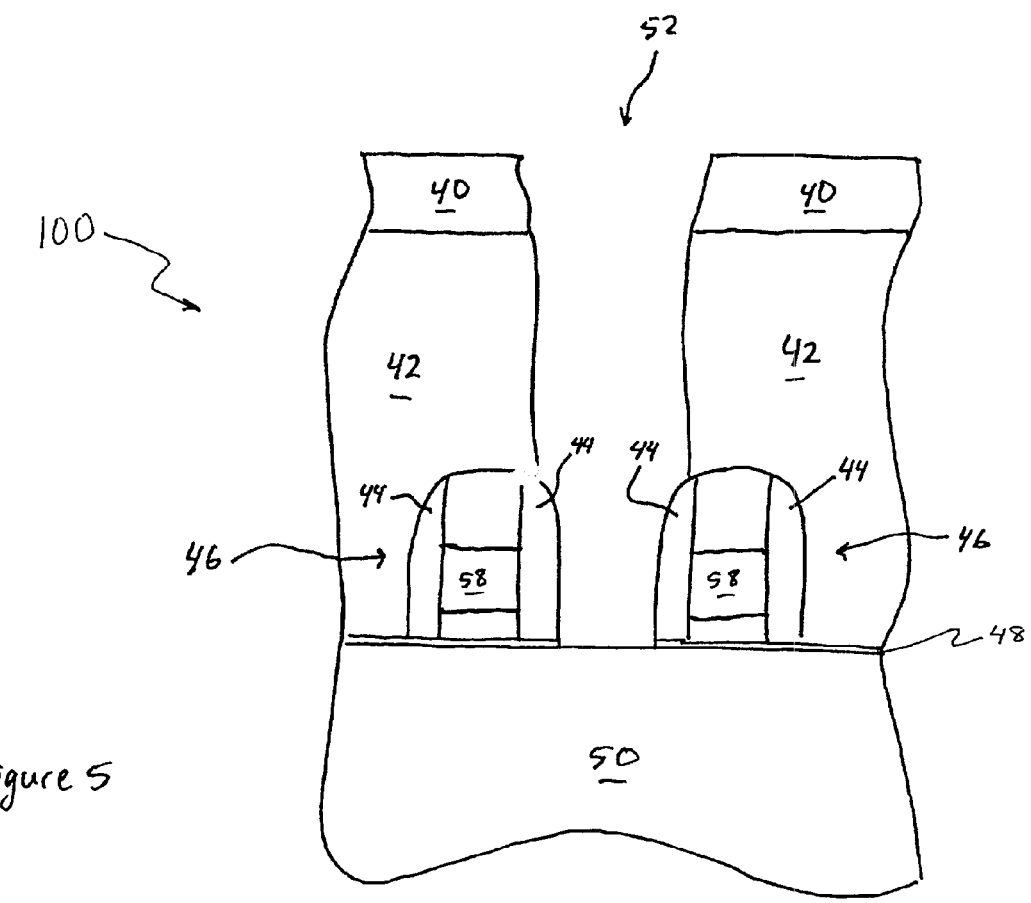
FIG. 5 is an elevational cross-section view of the semiconductive substrate depicted in FIG. 2A under etch conditions containing about a 25% gas presence of $CF_4$.

FIG. 5 illustrates a third test under the inventive conditions in which $CF_4$ has been increased to 15 parts in order to significantly increase selectivity to nitride. In other words, selectivity to spacer 44 during the formation of contact 52 has been enhanced to the point that spacer 44 disposed within contact 52 is substantially intact after the self-aligned anisotropic contact etch. Operating conditions for this example include $CHF_3$ in about 44 parts and $CF_4$ in about 13 to about 17 parts.

FIGS. 3–5 illustrate the enhanced selectivity to nitride of spacer 44 as a function of incrementally increasing the $CF_4$ gas. As thus illustrated in FIGS. 3–5, the degree of etch selectivity to spacer 44 is noted and the etch recipe may be adjusted until a preferred selectivity to spacer 44 has been determined.

Preferred processing conditions for the formation of contact 52 depicted in FIGS. 3–5, include power at outer antenna 32 in a range from about 700 watts to about 1,050 watts, preferably from about 775 watts to about 975 watts, and most preferably about 875 watts. Inner antenna 30 is operated under conditions in a range from about 100 watts to about 150 watts, preferably from about 115 watts to about 135 watts. Most preferably, when outer antenna 32 is operated at 875 watts, inner antenna 30 is operated at 125 watts. Bottom power applied to semiconductive substrate support 16 is operated in a range from about 500 watts to about 700 watts, preferably from about 550 watts to about 650 watts, and most preferably about 600 watts.

The temperature of semiconductive substrate support 16 is operated in a range from about $-30°$ C. to about $+80°$ C., preferably from about $-20°$ C. to about $+70°$ C., and most preferably about $+40°$ C.

Performing Two Etches Within a Low Temperature Range

In another embodiment of the present invention, a combination of a mask-aligned, high-aspect ratio contact anisotropic etch and a self-aligned contact etch is carried out by using the inventive etch recipe and conditions. The inventive method proceeds by etching a contact under mask-aligned contact etch conditions that include a roof surface temperature in the etch chamber at or below about $200°$ C. Without changing the etch temperature range of the etch chamber, a second, high-aspect ratio etching of a self-aligned contact is carried out with $CHF_3$ and an etch selectivity fluorocarbon gas. The self-aligned contact etch is carried out at a roof surface temperature at or below about $190°$ C. in any of the above-mentioned preferred temperature ranges. This method of etching mask-aligned contacts and self-aligned contacts allows for the etch selectivity fluorocarbon gas to make the etch recipe more selective to the nitride layer. The above-mentioned ratios of etch selectivity fluorocarbon gases and proportions to the $CHF_3$ gases are also preferable for this embodiment. In particular, the etch selectivity fluorocarbon gas is preferably $CF_4$ and is supplied in a range from about 1 to about 15 parts and a hydrofluorocarbon gas, preferably $CHF_3$ is supplied in about 44 to 45 parts.

In the present embodiment, the etch selectivity fluorocarbon gas preferably includes $CF_4$ as the only component, or as a major component in a range from about $\frac{1}{4}$ to about $\frac{9}{10}$ of the etch selectivity fluorocarbon gas.

High-Aspect-Ratio Etching

In another embodiment of the present invention, an etching method is provided for forming a highaspect-ratio contact in a semiconductive substrate. The method includes providing an etcher 10 such as the Applied Materials IPS etch chamber. Etcher 10 has grounded silicon roof 14, semiconductive substrate supports 16, silicon ring 18, and other equipment as depicted in FIG. 1. Silicon roof 14 is operated at a roof surface temperature range from about $135°$ C. to about $190°$ C. Semiconductive substrate support 16 has a temperature range from about $-30°$ C. to about $+80°$ C., preferably from about $-20°$ C. to about $+70°$ C., and most preferably about $+40°$ C. Silicon ring 18 is operated in a temperature range from about $180°$ C. to about $300°$ C., preferably from about $190°$ C. to about $250°$ C., and most preferably about $200°$ C.

Figure 6:
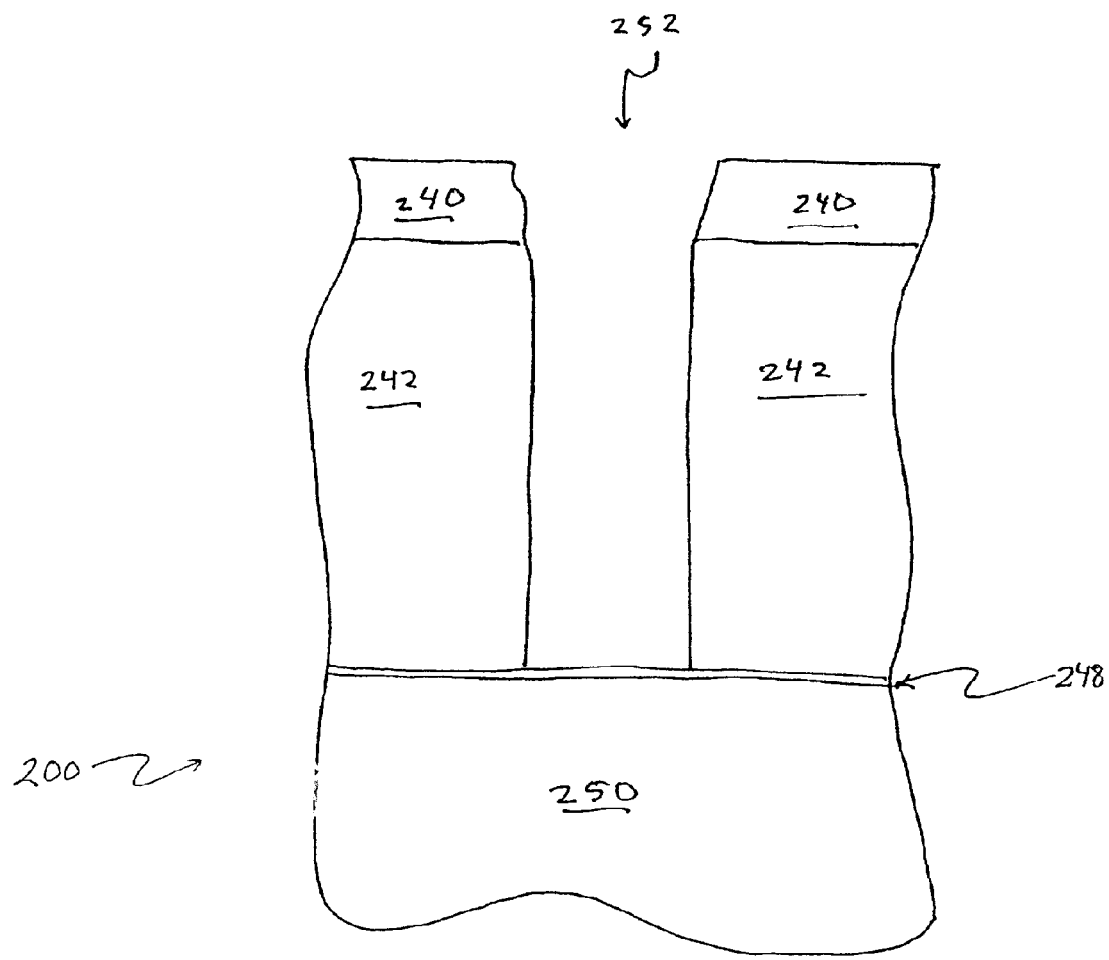
FIG. 6 is an elevational cross section view of a semiconductive substrate with a high-aspect ratio contact formed therein.

The inventive method continues as illustrated in FIG. 6 by providing semiconductive substrate 200, having bulk dielectric 242 disposed upon an optional etch stop layer 248. Additionally, an etch stop layer may include semiconductive material 250, or any material that is compositionally different from bulk dielectric 242. Preferably bulk dielectric 242 is BPSG and etch stop layer 248 is a gate oxide, or generally silicon nitride, or $Si_3N_4$, or monocrystalline silicon with layer 248 optionally absent. The inventive method continues by anisotropically etching contact 252 as depicted in FIG. 6 with a hydrofluorocarbon such as $CHF_3$ etch gas and an etch selectivity fluorocarbon gas etch recipe, wherein the $CHF_3$ is flowed in a range from about 30 to about 50 sccm and the etch selectivity fluorocarbon gas is flowed in a range from about 1 to about 15 sccm.

Under the foregoing conditions, selectivity to etch stop layer 242 is increased as the proportion of fluorocarbon gas increases. Bulk dielectric 242 can be composed of BPSG, TEOS, and the like, and can also be a thermal silicon dioxide formed from either monocrystaline silicon or polycrystaline silicon. Etch stop layer 248 can be silicon nitride and may also be a thermally converted refractory metal nitride such as cobalt nitride, titanium nitride, tungsten nitride, hafnium nitride, and the like.

Etching with an Etch Selectivity Fluorocarbon Gas in an Etch System

In another embodiment in the present invention, a system of etching a semiconductive substrate is provided. The system includes an etcher such as an Applied Materials IPS chamber. Etcher 10 is operated under the temperature control conditions set forth herein for roof and wall 14, semiconductive substrate support 16, and silicon ring 18. Other conditions include the above-mentioned flow rates, and pressures. The inventive system includes anisotropically etching the material of dielectric 42 in semiconductive substrate with a first etch recipe comprising $CHF_3$ and $CF_4$ in a first $CF_4$ proportion. Etching continues by etching the material of bulk dielectric layer 42 with a second etch recipe comprising $CHF_3$ in the same relative amount and $CF_4$ in a second, increased or decreased proportion, wherein etch selectivity is directly proportional to its increased amount or decreased amount of $CF_4$.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of removing silicon dioxide upon an etch stop layer, the method comprising:
   providing a silicon dioxide dielectric layer upon an etch stop layer, wherein the etch stop layer comprises refractory metal nitride;
   providing a gaseous etchant including a hydrofluorocarbon etch gas and including an etch selectivity enhancing fluorocarbon compound selected from the group consisting of $CF_4$, $C_2F_6$, $C_4F_8$, $C_5F_6$, $C_5F_8$, and combinations thereof; and
   exposing the silicon dioxide dielectric layer to the gaseous etchant in an etch chamber having a roof comprising silicon and having a temperature in a range from about 100° C. to about 200° C.

2. A method as defined in claim 1, wherein:
   the hydrofluorocarbon etch gas is provided at from about 30 sccm to about 50 sccm and the etch selectivity enhancing fluorocarbon compound is provided at from about 0 sccm to about 25 sccm; and
   the silicon dioxide dielectric layer is exposed to the gaseous etchant at a pressure of from about 10 mTorr to about 40 mTorr.

3. A method as defined in claim 1, wherein the hydrofluorocarbon is provided in a first quantity, the fluorocarbon is provided in a second quantity, and the first quantity is at least twice the second quantity.

4. A method as defined in claim 2, wherein the refractory metal nitride is selected from the group consisting of cobalt nitride, titanium nitride, tungsten nitride, and hafnium nitride.

5. A method according to claim 1, wherein etching the silicon dioxide electric layer in the gaseous etchant is carried out until the etch stop layer is exposed.

6. A method according to claim 1, wherein the selectivity compound is supplied in a range from about less than one part to about 15 parts, and the hydrofluorocarbon is $CHF_3$ supplied in a range from about 30 parts to about 50 parts.

7. A method according to claim 1, wherein the selectivity compound is supplied in about 15 parts and the hydrofluorocarbon is $CHF_3$ supplied in about 44 parts to about 45 parts.

8. A method according to claim 1, wherein the selectivity compound is supplied in a range from about 0.5 parts to about 4 parts and the hydrofluorocarbon is $CHF_3$ supplied in about 44 parts to about 45 parts.

9. A method of etching a self-aligned contact comprising:
   providing a refractory metal nitride etch stop layer on each gate stack in a pair of adjacent, spaced apart gate stacks situated over a semiconductive substrate and a silicon dioxide dielectric layer on the silicon nitride layer;
   placing the semiconductive substrate in an etch chamber, wherein the etch chamber has a roof comprising silicon;
   etching into the silicon dioxide dielectric layer in the etch chamber, wherein the etch chamber has a temperature in a range from about 100° C. to about 200° C., to form a self aligned contact hole between the pair of gate stacks without substantially etching the etch stop layer on the sidewalls of the contact hole, using gaseous $CHF_3$ and an etch selectivity enhancing compound selected from the group consisting of $CF_4$, $C_2F_6$, $C_4F_8$, $C_5F_6$, $C_5F_8$, and combinations thereof;
   etching the contact hole to the semiconductive substrate; and
   stopping said etching after the etch exposes the silicon nitride layer.

10. A method of removing silicon dioxide dielectric upon an etch stop layer that is situated upon a semiconductive substrate positioned within an etch chamber, the method comprising:
   etching the silicon dioxide dielectric to a first depth with a first etch recipe including a hydrofluorocarbon, the first etch recipe having a first selectivity to the etch stop layer, wherein the etch stop layer is refractory metal nitride;
   etching the silicon dioxide dielectric to a second depth with a second etch recipe including the hydrofluorocarbon and an etch selectivity enhancing compound comprising a fluorocarbon selected from the group consisting of $CF_4$, $C_2F_6$, $C_4F_8$, $C_5F_6$, $C_5F_8$, and combinations thereof, the second etch recipe having a second selectivity to the etch stop layer, wherein the first selectivity is greater than the second selectivity; and
   stopping the second etching upon the etch stop layer.

11. A method as defined in claim 10, wherein the selectivity compound is selected from the group consisting of $CF_4$, $C_2F_6$, $C_4F_8$, $C_5F_6$, $C_5F_8$, and combinations thereof.

12. A method as defined in claim 10, wherein the refractory metal nitride is selected from the group consisting of cobalt nitride, titanium nitride, tungsten nitride, and hafnium nitride.

13. A method as defined in claim 10, wherein the etch chamber has a roof comprising silicon that is at a temperature in a range from about 100° C. to about 200° C. while etching the silicon dioxide to the first and second depths.

14. A method as defined in claim 10, wherein the first etch recipe includes $CH_2F_2$, $CH_3F$, or mixtures thereof.

15. A method as defined in claim 10, wherein the selectivity compound is supplied in a range from about less than one part to about 15 parts, and the hydrofluorocarbon is supplied in a range from about 30 parts to about 50 parts.

16. A method as defined in claim 10, wherein the selectivity compound is supplied in about 15 parts and the hydrofluorocarbon is supplied in about 44 parts to about 45 parts.

17. A method as defined in claim 10, wherein the selectivity compound is supplied in a range from about 0.5 to about 4 parts and the hydrofluorocarbon is supplied in about 44 parts to about 45 parts.

18. A method as defined in claim 10, wherein:
the etch stop layer is a spacer on each gate stack in a pair of adjacent, spaced apart gate stacks situated over the semiconductive substrate;
the silicon dioxide dielectric is formed over and between the gate stacks; and
etching the silicon dioxide dielectric to the first and second depths forms a contact hole between the pair of gate stacks without etching the spacer.

19. A method as defined in claim 18, wherein the contact hole is self-aligned with respect to the pair of gate stacks.

20. A method as defined in claim 10, wherein the contact hole has an aspect ratio of at least 5:1.

21. An etching method comprising:
providing an etch chamber and a semiconductive substrate having thereon a bulk dielectric upon an underlying layer that comprises a refractory metal nitride;
etching the bulk dielectric with a first etch recipe including hydrofluorocarbon and an etch selectivity enhancing gas comprising fluorocarbon in a first proportion; and
etching the bulk dielectric with a second etch recipe including hydrofluorocarbon and the etch selectivity enhancing gas in a second proportion that is greater than the first proportion, wherein each selectivity to the underlying layer is greater for the second etch recipe than etch selectivity for the first etch recipe.

22. A method as defined in claim 21, wherein the fluorocarbon is supplied in time and concentration pulsed intervals.

23. A method as defined in claim 21, wherein the bulk dielectric layer is selected from the group consisting of doped and undoped silicon dioxide.

24. A method as defined in claim 21, wherein the selectivity gas is selected from the group consisting of $CF_4$, $C_2F_6$, $C_4F_8$, $C_5F_6$, $C_5F_8$, and combinations thereof.

25. A method as defined in claim 21, wherein the hydrofluorocarbon is $CHF_3$ supplied in about 30 parts to about 50 parts and the selectivity gas of the second etch recipe is supplied in a range from less than about 1 parts to about 15 parts.

26. A method as defined in claim 21, wherein:
the bulk dielectric is composed of silicon dioxide.

27. In an etch chamber having a roof composed of silicon, a semiconductive substrate support for supporting a semiconductive substrate having a bulk dielectric disposed upon an etch stop layer, and having a silicon ring surrounding the semiconductive substrate support, an etching method comprising:
maintaining the temperature of:
the roof of the etch chamber in a range from about 135° C. to about 200° C.;
the semiconductive substrate support in a range from about −30° C. to about 80° C.; and
the silicon ring in a range from about 180° C. to about 250° C.;
etching a recess having an aspect ratio of at least 5:1 in the bulk dielectric using a gaseous etchant including $CHF_3$ and an etch selectivity enhancing compound comprising carbon and fluorine;
etching the recess to the semiconductive substrate; and
stopping etching the recess after the etch stop layer has been exposed, wherein the etch stop layer comprises refractory metal nitride.

28. A method as defined in claim 27, wherein the refractory metal nitride is selected from the group consisting of cobalt nitride, titanium nitride, tungsten nitride, and hafnium nitride.

29. A method according to claim 27, wherein the bulk dielectric is composed of silicon dioxide and the etch stop layer is composed of silicon nitride.

30. A method as defined in claim 27, wherein:
the etch stop layer is a spacer on each gate stack in a pair of separated gate stacks situated over the semiconductive substrate;
the bulk dielectric is formed over and between the gate stacks; and
said etching forms a contact hole between the pair of gate stacks without etching the spacer.

31. A method of determining a specific etch recipe for etching silicon dioxide with predetermined selectivity to an etch stop layer underlying the silicon dioxide, the method comprising:
etching silicon dioxide with a gaseous etchant including a hydrofluorocarbon and an etch selectivity enhancing gas comprising carbon and fluorine to obtain a selectivity to the etch stop layer, wherein the etch stop layer comprises refractory metal nitride;
repeating said etching with different amounts of said etch selectivity enhancing gas comprising carbon and fluorine to correspondingly obtain different selectivities to said etch stop layer;
selecting an amount of said different amounts of said etch selectivity enhancing gas corresponding to a desired etch selectivity to said etch stop layer; and
etching silicon dioxide with a gaseous etchant including the hydrofluorocarbon and said selected amount of said selectivity gas to obtain said desired selectivity to the etch stop layer.

32. A method as defined in claim 21, wherein the selectivity gas is selected from the group consisting of $CF_4$, $C_2F_6$, $C_4F_8$, $C_5F_6$, $C_5F_8$, and combinations thereof.

33. A method as defined in claim 31, wherein the refractory metal nitride is selected from the group consisting of cobalt nitride, titanium nitride, tungsten nitride, and hafnium nitride.

34. A method as defined in claim 31, wherein:
the refractory metal nitride is a spacer on each gate stack in a pair of separated gate stacks situated over the semiconductor substrate;
the silicon dioxide is formed over and between the gate stacks;
each of said etching steps forms a contact hole between the pair of gate stacks without etching the spacer.

35. A method as defined in claim 34, wherein the contact hole has an aspect ratio of greater than about 5:1.

* * * * *

UNITED STATES PATENT AND TRADEMARK OFFICE
CERTIFICATE OF CORRECTION

PATENT NO. : 6,890,863 B1
APPLICATION NO. : 09/559504
DATED : May 10, 2005
INVENTOR(S) : Donohoe et al.

It is certified that error appears in the above-identified patent and that said Letters Patent is hereby corrected as shown below:

In column 13, line 65, in Claim 4, after "cobalt" delete ",".

In column 14, line 2, in Claim 5, delete "electric" and insert -- dielectric --, therefor.

In column 15, line 40, in Claim 21, delete "each" and insert -- etch --, therefor.

In column 16, line 49, in Claim 32, delete "claim 21" and insert -- claim 31 --, therefor.

Signed and Sealed this

Twenty-ninth Day of April, 2008

JON W. DUDAS
*Director of the United States Patent and Trademark Office*